United States Patent [19]

Wilner et al.

[11] Patent Number: 4,523,964
[45] Date of Patent: Jun. 18, 1985

[54] HIGH TEMPERATURE LAYERED SILICON STRUCTURES

[75] Inventors: L. Bruce Wilner, Palo Alto; Herbert V. Wong, San Francisco, both of Calif.

[73] Assignee: Becton, Dickinson and Company, Paramus, N.J.

[21] Appl. No.: 480,528

[22] Filed: Mar. 30, 1983

Related U.S. Application Data

[62] Division of Ser. No. 233,728, Feb. 12, 1981, Pat. No. 4,400,869.

[51] Int. Cl.³ .................. H01L 29/84; H01L 21/225
[52] U.S. Cl. ........................... 148/33.2; 29/576 C; 29/580; 29/589; 29/610 SG; 148/33.3; 148/33.4; 148/188; 148/DIG. 12; 148/DIG. 159; 148/DIG. 168; 338/2; 338/4; 357/26
[58] Field of Search ................ 148/33.3, 33.4, 33.2, 148/188; 29/580, 589, 610 SG, 576 C; 338/2, 4; 357/26

[56] References Cited

U.S. PATENT DOCUMENTS

| 3,900,811 | 8/1975 | Kurtz et al. | 29/610 SG |
|---|---|---|---|
| 3,922,705 | 11/1975 | Yerman | 338/2 X |
| 4,016,644 | 4/1977 | Kurtz | 338/2 X |
| 4,065,970 | 1/1978 | Wilner | 338/4 X |
| 4,121,334 | 10/1978 | Wallis | 29/589 |
| 4,291,293 | 9/1981 | Yamada et al. | 357/26 X |

OTHER PUBLICATIONS

Vick, G. L., "High-Temperature Solid-State Pressure Transducer" Technical Report AFFDL-TR-70-163, Dec. 1970.

*Primary Examiner*—William G. Saba
*Attorney, Agent, or Firm*—R. P. Grindle

[57] ABSTRACT

The invention relates to a process for producing silicon diaphragm pressure transducers, and to pressure transducers so produced, which will operate in high temperature applications above 150° C. by properly insulating the strain gauges from the diaphragm. This is achieved by utilizing two properly oriented silicon wafers which are joined together by a two-step diffusion technique, which includes the diffusion bonding of one boron doped wafer surface into the other wafer surface previously oxide coated, at greatly reduced pressures and temperatures than heretofore used. This simultaneous diffusion takes place because of prior contouring or the forming of relief channels into one of the bonded surfaces, and because only one joined surface is oxide coated, thus reducing process times substantially. That is, there is a continuous diffusion of boron into the boron oxide coated surface resulting in a boron rich layer of great uniformity. The process includes a mechanical lapping and selective etching which leaves the extraordinarily level boron rich surface which is very uniform and ready for processing and connection into other transducer parts. The invention is particularly advantageous in the ease of fabrication which reduces the cost of the final transducer.

7 Claims, 11 Drawing Figures

HIGH TEMPERATURE LAYERED SILICON STRUCTURES

This is a division, of application Ser. No. 233,728, filed Feb. 12, 1981, now U.S. Pat. No. 4,400,869.

BACKGROUND AND STATEMENT OF THE INVENTION

Generally speaking, this invention relates to a process for producing miniaturized pressure transducers, and, more particularly, to the preparation of such transducers which will tolerate elevated temperatures in use. Such transducers are of the kind which have a diaphragm which is contoured to concentrate and control the induced stress in the areas of the piezoresistor gauges, and to direct stresses to the gauges so as to sense, in the areas where the transducers are mounted, differentiations in pressure. More particularly, this invention relates to a process for producing silicon diaphragm pressure transducers or semiconductors, and to pressure transducers or semiconductors so produced, by utilizing two specifically oriented silicon wafers which are joined together by diffusion techniques which use reduced and less costly operating parameters. The resulting transducers and/or semiconductors have a gauge film surface which is rich in boron, extremely level, and extraordinarily uniform throughout the extent thereof.

The art of fabricating pressure transducers by diffusing piezoresistor gauges into a silicon diaphragm is well known. In this connection, reference is made to U.S. Pat. No. 4,065,970 issued Jan. 3, 1978, which is hereby incorporated by reference in its entirety wherein a single silicon wafer is utilized. Also, reference is made to U.S. Pat. No. 3,858,150, issued Dec. 31, 1974 wherein a multilayered silicon wafer arrangement is disclosed. The problem with prior art devices is that they do not provide proper insulation of the strain gauges from the diaphragm which is exposed to elevated temperatures. Therefore, the pressure transducer fails upon being exposed to elevated temperatures commonly achieved in industrial practice.

With this invention, by contrast, a simplified process is provided for formulating silicon diaphragm pressure transducers or semiconductors which will operate in high temperature applications above 150° C., the usual maximum temperature for such devices, and which process is simplified and easily carried out utilizing processing temperatures and pressures which are at a much lower level, then previously achieved, which makes the process herein much more appropriate for mass production techniques.

DETAILED DESCRIPTION OF THE INVENTION

The transducer or semiconductor of the invention may be fabricated in two layers comprised of silicon wafers which are bonded with a high-temperature bond. Both wafers are single crystal silicon wafers. One wafer is shaped, preferably prior to joining to the second wafer, by etching to form a high-efficiency pressure summing diaphragm in accordance with the teachings of U.S. Pat. No. 4,065,970 referred to above. While such a preliminary etching is not required, it is considered preferable as being a more efficient approach to the ultimate product produced, in accordance herewith when pressure transducers are being formulated. The other wafer, the gauge layer in this case, is of extreme thinness, when the processing, in accordance herewith is completed and preferably is patterned by etching into it strain gauges at the high-strain points of the diaphragm, once the two layers are combined in accordance with this process.

Thus, with this invention, a dual layer transducer is formed with an extraordinarily uniform and level thin layer in the form of the gauge layer and a thicker layer in the form of the diaphragm layer. The thin layer is formed by selectively etching lightly doped silicon from that portion of the gauge layer, as it is finally formed, which has been previously heavily doped with boron. The heavy doping of the gauge layer is required for the preferential etching which takes place during the processing hereof, but is also convenient to its piezoresistive function because the temperature coefficient of the gauge factor is low, and the temperature coefficient of resistance is high enough that such decline of gauge factor with temperature is compensated for by use of appropriate series resistors.

Alternatively, a semiconductor structure may be formed comprised of a layered silicon wafer, which may be of any specified orientation and thickness, and which has an insulating layer of silicon dioxide. In this instance, the insulating layer includes 15% or less boron oxide. The structure includes, in addition, an electrically active layer of single crystal silicon of uniform thickness which will be about one (1) micrometer in thickness, into which such arrangements as resistors, field effect transistors, and piezoresistors may be formed. It will be appreciated that the insulating layer not only provides mechanical support, but also acts as a heat sink for the active layer. It may be shaped to provide low overall stress, or locally concentrated stress in the active layer.

In considering generally the conditions for carrying out the process, in accordance with this invention, two thin silicon wafers are selected which are to be joined together in accordance with the process herein. The "diaphragm" silicon wafer is oriented (100), polished on both sides, and as discussed above, is etched on one side to an array of stress-concentrating pressure diaphragms with their linear features aligned in the [110] direction. The gauge wafer of silicon is the N-type, and is lightly doped and oriented (100) and indexed [110]. Preferably, it is polished on one side and lapped flat on the other side. This wafer is given a boron "predeposition" layer with the boron being deposited on the polished side of the wafer. In the processing hereof, it is preferable that the wafer be stored in a low-humidity area if it is not to be used right away in order to retard hydration of the deposited boron layer.

Subsequently to the boron deposition on the gauge wafer, the boron side of the gauge wafer is assembled to the flat side of the diaphragm wafer and aligned with the [110] indices parallel. In this connection, the alignment is locked with parafin wax in order to maintain the alignment during subsequent processing operations. The two layers are then pressed together under temperature and pressure in order to join them initially. Subsequently, the layers are placed under high temperature to cause diffusion of the two adjoining surfaces into each other.

One of the features of this invention is that only the diaphragm layer is coated with $SiO_2$ prior to the joining together of the two wafers. Thus, during the subsequent diffusion of the two adjoining layers into each other to cause the formation of the wafer pair for the ultimate pressure transducer, there is a simultaneous diffusion of the boron into the gauge layer, and of the boron oxide into the $SiO_2$ coating on the diaphragm layer. Prior art procedures involved a coating of $SiO_2$ on both layers prior to the joining thereof. The second $SiO_2$ layer has the effect of reducing the maintenance of the diffusion of the boron into the gauge layer, while with the invention here the boron rich layer resulting is continuously enriched during the diffusion process.

In considering the further processing of the wafer pair now joined together, the gauge wafer side of the wafer pair may be subsequently lapped to reduce the thickness thereof. Subsequent to this lapping process, the gauge wafer is etched in a selective etching procedure to strip off the lightly doped portion of the remaining gauge wafer leaving only a boron rich film.

Subsequently, further processing takes place including etching the strain gauge bridge pattern onto the gauge layer of the wafer pair, and applying individual pressure sensors and aluminum lead wires for assembly of the transducer parts to the wafer pair, formulated in accordance herewith.

With the foregoing and additional objects in view, this invention will now be described in more detail, and other objects and advantages hereof will be apparent from the following description, the accompanying drawings, and the appended claims.

DETAILED DESCRIPTION OF THE INVENTION

Figure 1A:
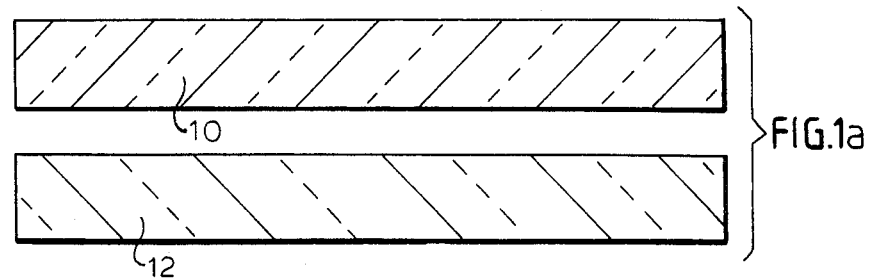
FIGS. 1a-1i are somewhat diagramatic views, in section, illustrating the sequential processing conditions of the two wafers, in the form of a die cut from each one, and as they are being processed in accordance with this invention.
Figure 1B:
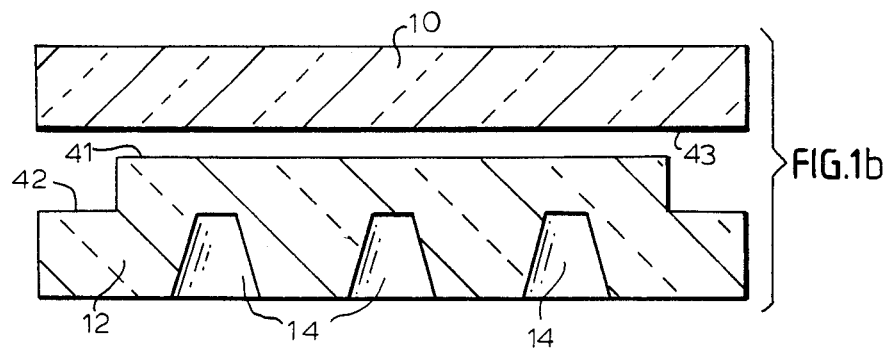

Referring to the drawings in which like reference characters refer to like parts throughout the several views thereof, FIG. 1a shows a gauge silicon wafer 10 and a diaphragm silicon wafer 12 prior to being joined, in accordance with the processing steps of the invention herein. The diaphragm wafer 12, as shown in FIG. 1b, is etched on one side to an array of stress-concentrating pressure diaphragms 14, with the longitudinal axis of the diaphragms being aligned in the [110] direction. Furthermore, and as will be discussed in more detail below, one aspect of this invention includes the fact that the flat or gauge side 41 of diaphragm wafer 12 is contoured at 42 so that the waste spaces which are eventually cut away are recessed. This contouring has the effect, furthermore, of forming relief channels into one of the bonded surfaces during subsequent operations. Preferably, this recess dimension is within the range of 1-5 micrometers.

Figure 1C:
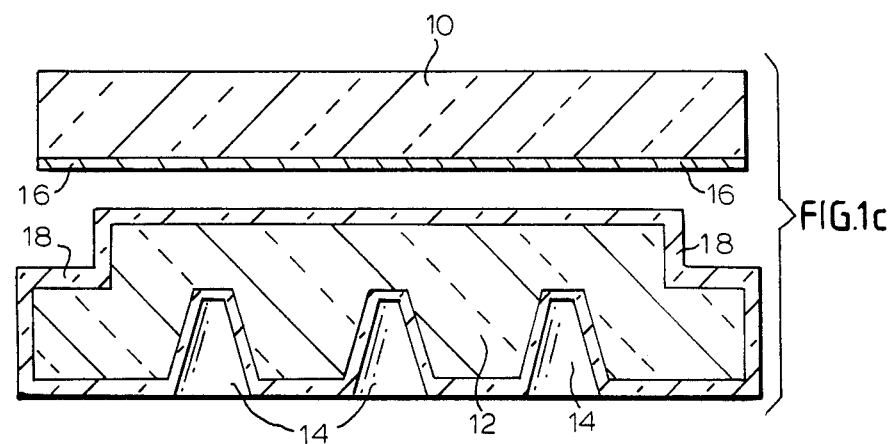
Figure 1D:
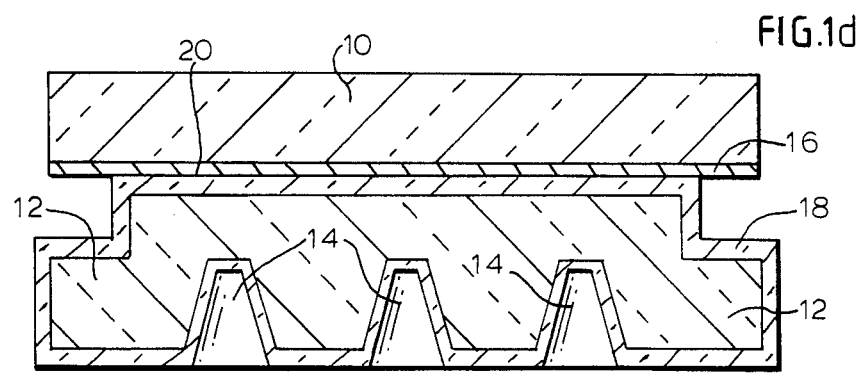
Figure 1E:
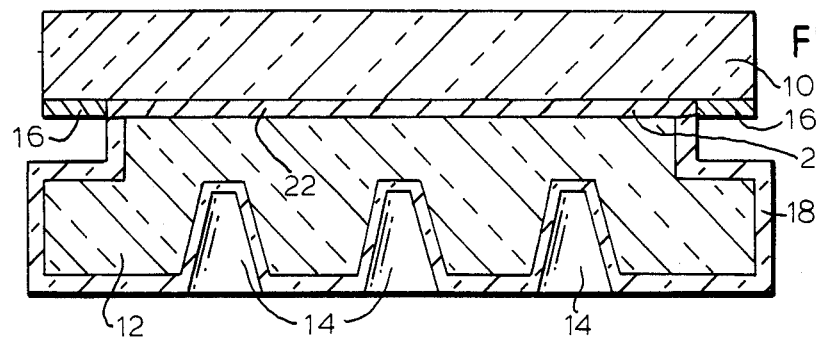

As a further processing step, and as shown in FIG. 1e, gauge wafer 10, which may be comprised of a negative-type lightly doped wafer of silicon oriented (100) and indexed [110], prior to further processing of the gauge silicon wafer, is polished on one side and lapped flat on the opposite side. Subsequent to this processing, a $B_2O_3$ "predeposition" layer is deposited on the polished side 43 of the gauge wafer.

This deposition procedure takes place in a conventional furnace wherein $B_2O_3$ is deposited in about 7 minutes at 1100° C. Subsequently, it is held for about 35 minutes at 1100° C. in order to impart proper preliminary deposition of boron into the gauge wafer. Thus, as is shown in FIG. 1c, gauge layer 10 has deposited on polished side 43 thereof a boron layer 16.

Figure 3:
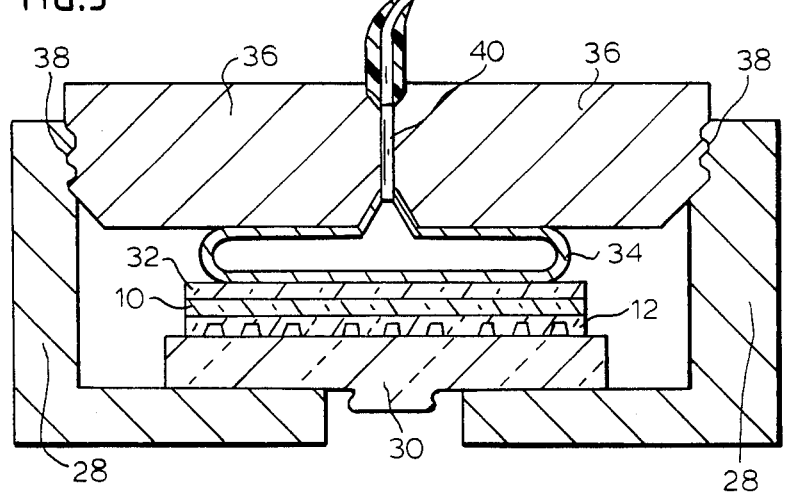
FIG. 3 is a diagramatic illustration of a press useful in the joining of the two wafer pairs in accordance with one processing step of the invention.

During this pre-processing of the gauge layer, and prior to the joining thereof to the diaphragm layer, the diaphragm layer wafer 12 is also pre-processed by having deposited thereon a $SiO_2$ layer 18, as shown in FIG. 1c. Referring now to FIG. 1d, gauge layer 10 is combined with and/or joined to diaphragm layer 12, and as noted above, fixed by wax in a proper alignment with the boron side 16 of gauge layer 10 assembled to the flat side 41 of diaphragm layer 12, and aligned with the [110] indices parallel. The joined wafer pair is then mounted in a press. Reference is made to FIG. 3 showing a press for this purpose having a frame 28 with a massive silicon anvil 30, and a stainless steel pneumatic bladder 34 with a lapped silicon wafer 32 placed between the bladder 34 and gauge wafer 10 as a buffer.

The procedure for initially joining the wafer pair together is to impart a light pressure in the bladder of about two pounds per square inch (psi). The press is then heated to 850° C. Subsequently, after the 850° C. temperature level is reached, the pressure is increased to 60 psi and the pressure is held there for six hours at the temperature of 850° C. The temperature is selected to be above the melting temperature of $B_2O_3$, but not high enough to drastically reduce the life of the stainless bladder. The relatively long dwell time allows local concentrations of $B_2O_3$ to flow into the recesses in the diaphragm wafer, and to allow some initial diffusion of $B_2O_3$ into the $SiO_2$. After the dwell period has past, pressure is removed before the press is cooled.

Figure 1F:
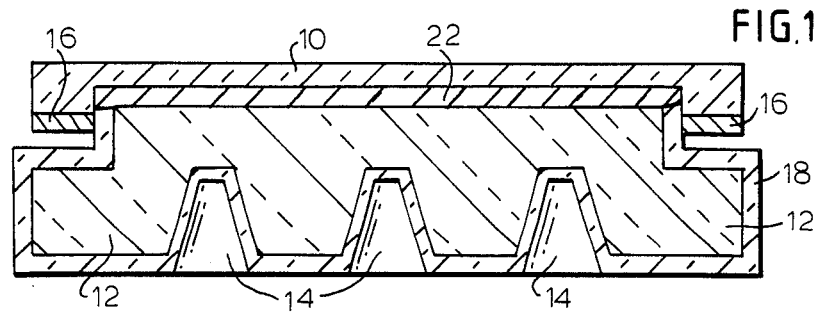

Subsequently, in the processing of the invention here, the joined wafer pair is removed from the press and placed in a conventional diffusion furnace where the pair is heated to 1035° C. for about two hours to bring about the ultimate diffusion of the $B_2O_3$ into the $SiO_2$. The boron has the further effect, during this diffusion process of doping the ultimate exposed surface of the gauge wafer by diffusion from the $B_2O_3$ source. That is, the boron diffuses further into the gauge wafer 10 so that when gauge wafer 10 is subsequently lapped during further processing, the boron doped gauge wafer portion may be readily exposed during subsequent etching. FIG. 1e shows the combined wafer pair after this final diffusion process in a conventional diffusion furnace showing the diffused and combined layers 22 of boron oxide and silicon dioxide. Subsequent to this diffusion process, wafer layer 10 is mechanically lapped to a thin layer as shown in FIG. 1f. Preferably, the thickness of the gauge wafer after this mechanical lapping is within the range of 0.0005 and 0.0025 inches.

As an additional feature of this invention, at this point, gauge wafer 10 is preferentially etched in a hot caustic etch buffered with alcohol in order to remove or strip off the lightly doped silicon portion of the gauge wafer, leaving only the boron rich film which is essentially what is left of gauge wafer 10 after this processing procedure. By the application of the chemical etch, an extraordinary level film surface 45 is produced which provides a much better base than ever produced heretofore for the strain gauges subsequently formed from it.

The resulting gauge film 10, is further, extremely uniform, to a degree not previously contemplated. The threshold of etch resistance is within the range of between about $5 \times 10^{19}$ and $1 \times 10^{20}$ atoms of boron per cc of the resulting leftover gauge layer film.

Figure 1G:
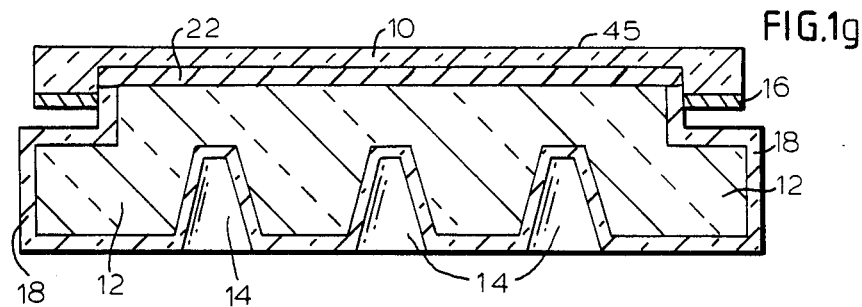
Figure 1H:
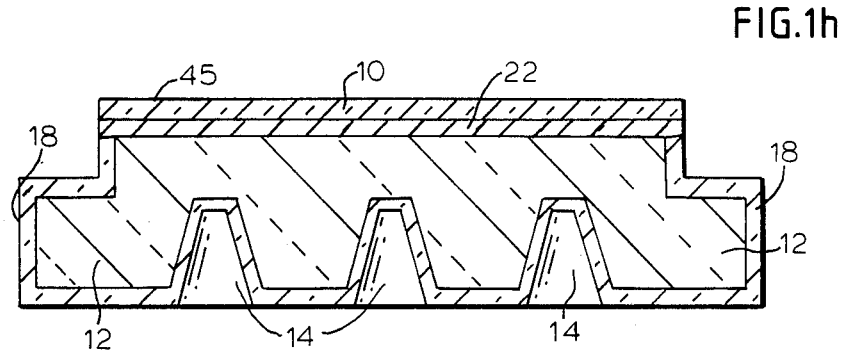

The overhang portion 16 of the gauge layer 10, as shown in FIG. 1g is subsequently removed mechanically above recess 42 in the diaphragm layer 12. An aspect of this invention is, as mentioned above, that the recess contour 42 is imparted to diaphragm layer 12 in order to enhance the uniformity of bonding of the silicon dioxide/boron oxide diffusion from one layer to the other in the diffusion joining of gauge layer 10 to diaphragm layer 12 at lower operating temperature and pressure levels. Once the mechanical removal of the overhang 16 takes place, the wafer pair, in section, has the appearance shown in FIG. 1h.

Figure 1I:
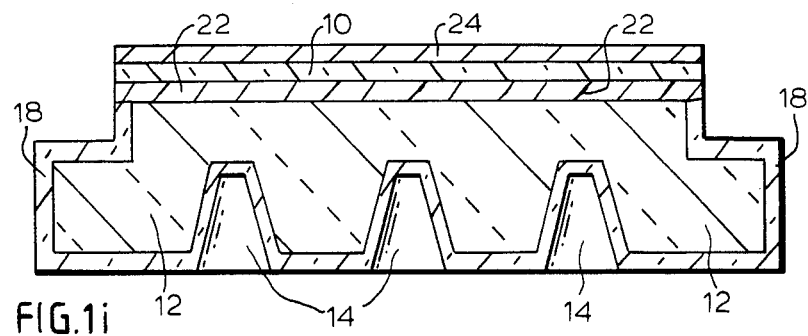
Figure 2:
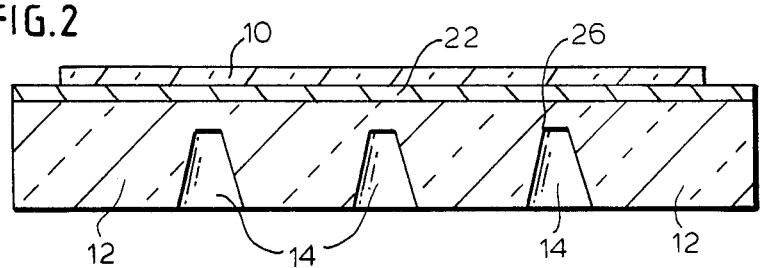
FIG. 2 is an enlarged sectional view of a wafer pair produced according to the process steps of FIG. 1.

Subsequent, to the mechanical removal of the overhang, a masking oxide layer 24 is grown on the gauge wafer side of the wafer pair at a temperature of 1030° C. in a wet oxygen environment. This oxide layer is about 0.5 micrometers in thickness, consuming during the deposition thereof 0.25 micrometers of the remaining gauge layer 10 which is now in the form of a film, as described above. The oxide film layer 24 is shown in FIG. 1i.

Thus, as will be appreciated by practitioners in the art, the procedure as described above, provides for the preparation of a wafer for use as a silicon diaphragm pressure transducer which will function at elevated temperatures. Moreover, with some modifications of such procedures, semiconductors may be prepared also. The processing procedures involved utilize operating parameters which are substantially reduced from those utilized in the prior art, making the process herein ideal for mass production techniques, because of the reduced requirements of pressure and temperature, as well as less complicated mechanical applications.

As will be appreciated, the wafer pair produced in accordance with the procedures outlined above, is then further processed in accordance with the usual procedures for preparing the diaphragm pressure transducer for assembly with the other transducer parts. That is, the strain gauge bridge pattern is etched into the oxide layer which has been grown on the gauge layer 10. This etching procedure is carried out in an acid fluoride solution followed by a further etching of the bridge pattern into the gauge film 10 with a combined hydrogen fluoride-nitric acid etchant. After this strain gauge bridge pattern has been etched into the oxide layer 24 and the gauge layer 10, the wafer pair is re-masked and windows are opened into the oxide layer 24 for metalization procedures. Subsequent to this, aluminum is deposited and by photoprocessing procedures the "contact" and "conductor" areas are defined. Further, the aluminum film is sintered to the gauge film.

After these various procedures have been carried out, individual pressure sensors are diced from the wafer pair and sorted for acceptability. Then aluminum lead wires are attached in the usual manner and the individual pressure sensors are bonded with solder-glass to the silicon support member, and assembled to the other transducer parts with high-temperature organic resins.

Thus, as will be appreciated, the invention here teaches a process which fulfills a need for pressure measurements at commonly achieved temperatures in that silicon piezoresistive pressure transducers are formulated which extend the range at which they operate, and will operate at elevated temperatures well above the previous maximum of 150° C., up to a maximum of at least 300° C., and in some cases up to 450° C., because the strain gauges are adequately insulated from the diaphragm at the elevated temperatures. Moreover, the process of the invention here produces these pressure transducers in miniaturized sizes with large sensitivity and small time constants, and with freedom from hysteresis.

The transducers and semiconductors of the invention can be readily fabricated by mass production techniques utilizing relatively low operating temperatures and pressures. These low operating parameters make the process of the invention here and the product produced by that process particularly useful from a cost standpoint, as will be appreciated by practitioners in the art. Obviously, all of the above serves to make the methods and the products produced by those methods in accordance herewith highly advantageous commercially.

While the methods and the products produced by the methods herein disclosed form preferred embodiments of this invention, this invention is not limited to those specific methods and products, and changes can be made therein without departing from the scope of this invention which is defined in the appended claims.

What is claimed is:

1. A laminate for use as a high temperature pressure transducer, said laminate comprised of a silicon wafer oriented (100) and having a silicon gauge wafer film rich in boron laminated to one side thereof, said laminate obtained by the steps of
    (a) selecting a diaphragm wafer;
    (b) selecting a gauge wafer;
    (c) depositing in a first depositing step a boron rich layer on one surface of said gauge layer;
    the improvement characterized by
    (d) depositing in a second depositing step silicon dioxide on one surface of said diaphragm layer;
    (e) orienting said diaphragm wafer with said gauge wafer so that said boron rich layer is adjacent said silicon dioxide layer;
    (f) subjecting in a first subjecting step said wafers to temperature and pressure conditions sufficient to cause adhesion between said boron rich layer and said silicon dioxide layer;
    (g) said first subjecting step is carried out in a press first at a pressure at about two pounds per square inch for a time sufficient to elevate said temperature to an adhesion temperature above the melting temperature of said boron rich layer;
    (h) said first subjection step is carried out secondly by maintaining said elevated temperature for six hours at an elevated pressure within the range of between about above two and sixty pounds per square inch;
    (i) subjecting in a second subjecting step said oriented wafers to temperature conditions sufficient to simultaneously diffuse said boron rich layer into both said gauge wafer and said silicon dioxide layer on said diaphragm wafer;
    (j) removing a substantial portion of said gauge wafer from the surface thereof opposite said diaphragm wafer to provide a boron rich gauge wafer film;
    (k) said removing step including preferentially etching said gauge wafer to a uniform thickness; and
    (l) said uniform thickness is within the range of between about $5 \times 10^{19}$ and $1 \times 10^{20}$ atoms of boron per cubic centimeter of remaining gauge film.

2. The laminate of claim 1, further characterized as being produced by
   (a) said removing step including mechanical lapping followed by chemical etching.
3. The laminate of claim 1, further characterized as being produced by the additional step of
   (a) prior to said second depositing step, said diaphragm wafer is oriented (100), polished on both sides and etched on one side to form an array of stress-concentrating pressure diaphragms.
4. The laminate of claim 3, further characterized as being produced by the additional step of
   (a) said stress concentrating diaphragms having the linear features thereof parallel with each other and aligned in the [110] direction.
5. The laminate of claim 1, characterized as being produced by the additional step of
   (a) prior to said second depositing step, contouring said diaphragm layer on the side thereof which is to receive said silicon dioxide deposition.
6. The laminate of claim 5, characterized as being produced by the additional step of
   (a) mechanically removing an overhang on said gauge wafer formed by the portion thereof extending beyond the contour of said diaphragm layer formed by said contouring step.
7. The laminate of claim 1, characterized as being produced by the additional steps of
   (a) growing a masking oxide layer on said gauge wafer film;
   (b) etching a strain gauge bridge pattern into said masking oxide and said gauge wafer film; and
   (c) forming windows to contact areas and conductor areas on said gauge film surface.

* * * * *